United States Patent
Gopalan et al.

(10) Patent No.: US 9,097,979 B2
(45) Date of Patent: Aug. 4, 2015

(54) BLOCK COPOLYMER-BASED MASK STRUCTURES FOR THE GROWTH OF NANOPATTERNED POLYMER BRUSHES

(71) Applicant: Wisconsin Alumni Research Fondation, Madison, WI (US)

(72) Inventors: Padma Gopalan, Madison, WI (US); Daniel Patrick Sweat, Madison, WI (US); Myungwoong Kim, Madison, WI (US); Eungnak Han, Hillsboro, OR (US)

(73) Assignee: Wisconsin Alumni Research Foundation, Madison, WI (US)

( * ) Notice: Subject to any disclaimer, the term of this patent is extended or adjusted under 35 U.S.C. 154(b) by 324 days.

(21) Appl. No.: 13/800,178

(22) Filed: Mar. 13, 2013

(65) Prior Publication Data
US 2014/0272673 A1 Sep. 18, 2014

(51) Int. Cl.
B05D 1/36 (2006.01)
B05D 3/00 (2006.01)
B05D 5/00 (2006.01)
G03F 1/50 (2012.01)
G03F 7/20 (2006.01)

(52) U.S. Cl.
CPC ... *G03F 1/50* (2013.01); *B05D 5/00* (2013.01); *B05D 2506/00* (2013.01); *G03F 7/20* (2013.01)

(58) Field of Classification Search
None
See application file for complete search history.

(56) References Cited

U.S. PATENT DOCUMENTS

| | | |
|---|---|---|
| 8,362,179 B2 | 1/2013 | Gopalan et al. |
| 2006/0258826 A1 | 11/2006 | Matyjaszewski et al. |
| 2008/0045686 A1 | 2/2008 | Meagher et al. |
| 2009/0111703 A1 | 4/2009 | Gopalan |
| 2010/0036055 A1 | 2/2010 | Hayashi et al. |
| 2010/0124629 A1 | 5/2010 | Gopalan et al. |
| 2011/0201201 A1 | 8/2011 | Arnold et al. |
| 2012/0116007 A1 | 5/2012 | Gopalan et al. |
| 2013/0018122 A1 | 1/2013 | Woods et al. |
| 2014/0235755 A1 | 8/2014 | Gopalan et al. |

OTHER PUBLICATIONS

Yameen et al., Surface Initiated Polymerization on Pulsed Plasma Deposited Polyallylamine: A Polymer Substrate-Independent Strategy to Soft Surfaces with Polymer Brushes, Macromol. Rapid Commun., 2011, 32, 1735-1740.*
In et al., Side-Chain-Grafted Random Copolymer Brushes as Neutral Surfaces for Controlling the Orientation of Block Copolymer Microdomains in Thin Films, Langmuir, 2006, 22, 7855-7860.*

(Continued)

*Primary Examiner* — Timothy Meeks
*Assistant Examiner* — Michael P Rodriguez
(74) *Attorney, Agent, or Firm* — Bell & Manning, LLC (57) ABSTRACT

Block copolymer-based mask structures for the growth of patterned polymer brushes via surface-initiated atom transfer radical polymerization (SI-ATRP) are provided. Also provided are methods of making the mask structures and methods of using the mask structures to grow patterned polymer brushes. The mask structures comprise a substrate having a surface, a neutral layer comprising a crosslinked copolymer film disposed on the surface of the substrate and a domain-forming block copolymer film disposed on the crosslinked copolymer film. The crosslinked copolymer film comprises crosslinked random copolymer chains having pendant alkyl halide functional groups that are capable of acting as ATRP initiating sites.

16 Claims, 6 Drawing Sheets

(56) References Cited

OTHER PUBLICATIONS

Coad et al., A Substrate-Independent Method for Surface Grafting Polymer Layers by Atom Transfer Radical Polymerization: Reduction of Protein Adsorption, Acta Biomaterialia, 8, 2012, 608-918.*

Harrison et al., Lithography with a Mask of Block Copolymer Microstructures, J. Vac. Sci. Technol. B., 16(2), Mar./Apr. 1998, 544-552.*

Ryu et al., Surface Modification with Cross-Linked Random Copolymers: Minimum Effective Thickness, Macromolecules 2007, 40, 4296-4300.*

Dong et al., Controlling Polymer Topology by Atom Transfer Radical Self Condensing Vinyl Polymerization of p-(2-Bromoisobutyloylmethyl)styrene, Macromolecules, vol. 43, Oct. 7, 2010, pp. 8790-8798.

Chen et al., Multiphase design of autonomic self-healing thermoplastic elastomers, Nature Chemistry, vol. 4, Apr. 1, 2012, pp. 467-472.

Von Werne et al., A Versatile Method for Tuning the Chemistry and Size of Nanoscopic Features by Living Free Radical Polymerization, Available at http://www.pse.umass.edu/kcarter/images/polyprep441_459.pdf by or before Jan. 31, 2013.

Coessens et al., Functional polymers by atom transfer radical polymerization, Prog. Polym. Sci., vol. 26, 2001, pp. 337-377.

In et al., Side-Chain-Grafted Random Copolymer Brushes as Neutral Surfaces for Controlling the Orientation of Block Copolymer Microdomains in Thin Films, Langmuir, vol. 22, Aug. 1, 2006, pp. 7855-7860.

Barbey et al., Polymer Brushes via Surface-Initiated Controlled Radical Polymerization: Synthesis, Characterization, Properties, and Applications, Chem. Rev., vol. 109, Oct. 21, 2009, pp. 5437-5527.

Bates et al., Block Copolymers-Designer Soft Materials, Physics Today, vol. 52, 1999, pp. 32-38.

Farhan et al., AFM study of cationically charged polymer brushes: switching between soft and hard matter, Soft Matter, vol. 1, Apr. 20, 2005, pp. 66-68.

Han et al., Effect of Composition of Substrate-Modifying Random Copolymers on the Orientation of Symmetric and Asymmetric Diblock Copolymer Domains, Macromolecules, vol. 41, Nov. 6, 2008, pp. 9090-9097.

Husemann et al., Surface-Initiated Polymerization for Amplification of Self-Assembled Monolayers Patterned by Microcontact Printing, Angew. Chem. Int. Ed., vol. 38, No. 5, 1999, pp. 647-649.

Jeong et al., Soft Graphoepitaxy of Block Copolymer Assembly with Disposable Photoresist Confinement, Nano Letters, vol. 9, No. 6, May 7, 2009, pp. 2300-2305.

Jeong et al., Precise Control of Nanopore Size in Thin Film Using Mixtures of Asymmetric Block Copolymer and Homopolymer, Macromolecules, vol. 36, Dec. 2, 2003, pp. 10126-10129.

Liu et al., Integration of block copolymer directed assembly with 193 immersion lithography, J. Vac. Sci. Technol. B, vol. 28, Nov. 30, 2010, pp. C6B30-C6B34.

Russell et al., Controlling Polymer-Surface Interactions with Random Copolymer Brushes, Science, vol. 275, Mar. 7, 1997, pp. 1458-1460.

Marencic et al., Controlling Order in Block Copolymer Thin Films for Nanopatterning Applications, Annu. Rev. Chem. Biomol. Eng., vol. 1, Feb. 26, 2010, pp. 277-297.

Rastogi et al., Direct Patterning of Intrinsically Electron Beam Sensitive Polymer Brushes, ACS Nano, vol. 4, No. 2, Feb. 2, 2010, pp. 771-780.

Stuen et al., Dimensional Scaling of Cylinders in Thin Films of Block Copolymer-Homopolymer Ternary Blends, Macromolecules, vol. 42, Jun. 25, 2009, pp. 5139-5145.

Tugulu et al., Polymer Brushes as Ionotropic Matrices for the Directed Fabrication of Microstructured Calcite Thin Films, Angew. Chem. Int. Ed., vol. 45, Oct. 13, 2006, pp. 7458-7461.

Xiao et al., Graphoepitaxy of cylinder-forming block copolymers for use as templates to pattern magnetic metal dot arrays, Nanotechnology, vol. 16, Apr. 15, 2005, pp. S324-S329.

Xu et al., Spatially well-defined binary brushes of poly(ethylene glycol)s for micropatterning of active proteins on anti-fouling surfaces, Biosensors and Bioelectronics, vol. 24, Jul. 11, 2008, pp. 773-780.

Zhou et al., Multicomponent Polymer Brushes, J. Am. Chem. Soc., vol. 128, 2006, pp. 16253-16258.

Coad et al., A substrate-independent method for surface grafting polymer layers by atom transfer radical polymerization: Reduction of protein adsorption, Acta Biomaterialia, vol. 8, Oct. 11, 2011, pp. 608-618.

Von Werne et al., A Versatile Method for Tuning the Chemistry and Size of Nanoscopic Features by Living Free Radical Polymerization, J. Am. Chem. Soc., vol. 125, 2003, pp. 3831-3838.

Fan et al., Biomimetic Anchor for Surface-Initiated Polymerization from Metal Substrates, J. Am. Chem. Soc., vol. 127, 2005, pp. 15843-15847.

Wang et al., Self-Assembly of Catecholic Macroinitiator on Various Substrates and Surface-Initiated Polymerization, Langmuir, vol. 28, Dec. 28, 2011, pp. 2574-2581.

Yameen et al., Surface Initiated Polymerization on Pulsed Plasma Deposited Polyallylamine: A Polymer Substrate-Independent Strategy to Soft Surfaces with Polymer Brushes, Macromol. Rapid Commun., vol. 32, Aug. 19, 2011, pp. 1735-1740.

Sweat et al., Functional Crosslinked Mat to Create Nanopatterned Polymer Brushes, Poster Presented at 2012 MRS Fall Meeting, Boston, Nov. 25-30, 2012.

* cited by examiner

FIG. 6

BLOCK COPOLYMER-BASED MASK STRUCTURES FOR THE GROWTH OF NANOPATTERNED POLYMER BRUSHES

REFERENCE TO GOVERNMENT RIGHTS

This invention was made with government support under 0832760 awarded by the National Science Foundation. The government has certain rights in the invention.

BACKGROUND

Polymer brushes are a broad class of materials comprised of polymer chains that are tethered by one chain end to a surface. These brushes have a variety of applications due to their ability to tune and modify surface properties such as bioadhesion, wettability, and surface activity.

Two main methods for the preparation of polymer brushes have emerged, namely grafting "to" and grafting "from". The grafting "to" methodology involves the reaction of an end-functionalized polymer chain with an appropriate surface to anchor the polymer. Although grafting "to" allows for full characterization of the polymer before grafting, it is only applicable to a limited number of substrates and requires terminal functionality on the polymer chain-end. In addition, the grafting efficiency decreases with increasing molecular weight of the polymer.

Grafting "from" overcomes some of these limitations and has been used with a variety of polymerization techniques. By anchoring a suitable initiator to the substrate, polymer chains can be grown directly by the use of these various polymerization techniques. The majority of surface-anchored initiators comprise a self-assembled monolayer (SAM) on an appropriate substrate. However, SAMs have limited stability to various reagents and are not substrate-independent.

Surface-initiated atom transfer radical polymerization (SI-ATRP) has become a workhorse in the grafting "from" literature due to the ease in polymerizing a wide variety of monomers containing an array of functional groups with a high degree of control. Control in ATRP comes from the reversible redox activation of a dormant polymer chain-end (halide functionalized) by a halogen transfer to a transition metal complex. Many parameters are involved which can be tuned for better control, which provides an impressive window in which well-controlled polymers of numerous different monomers can be synthesized.

While the most common method for anchoring ATRP initiators to a substrate involves the formation of a SAM, some alternative methods have been presented in the literature. von Werne et al. describe the inclusion of 10~20% ATRP inimer in a mixture of curable monomers suitable for photopolymerization. (See, von Werne, T. A.; Germack, D. S.; Hagberg, E. C.; Sheares, V. V.; Hawker, C. J.; Carter, K. R., A Versatile Method for Tuning the Chemistry and Size of Nanoscopic Features by Living Free Radical Polymerization. *J. Am. Chem. Soc.* 2003, 125, 3831-3838.) This work was further extended by the use of an acid-cleavable ATRP inimer, allowing for direct measurement of surface grown brushes and their comparison with polymer grown from sacrificial initiator in solution. (See, Koylu, D.; Carter, K. R., Stimuli-Responsive Surfaces Utilizing Cleavable Polymer Brush Layers. *Macromolecules* 2009, 42, 8655-8660.) An alternate method for creating an inimer layer is to form an adhesive coating which contains moieties for initiator incorporation. For example, layers of poly(allylamine) (deposited by pulsed plasma polymerization) or catechol-amine (deposited by solution incubation) on various substrates were used for functionalizing a surface with ATRP initiators. (See, Yameen, B.; Khan, H. U.; Knoll, W.; Förch, R.; Jonas, U., Surface Initiated Polymerization on Pulsed Plasma Deposited Polyallylamine: A Polymer Substrate-Independent Strategy to Soft Surfaces with Polymer Brushes. *Macromol. Rapid Commun.* 2011, 32, 1735-1740, Coad, B. R.; Lua, Y.; Meagher, L., A Substrate-Independent Method for Surface Grafting Polymer Layers by Atom Transfer Radical Polymerization: Reduction of Protein Adsorption. *Acta Biomaterialia* 2012, 8, 608-618, Fan, X.; Lin, L.; Dalsin, J. L.; Messersmith, P. B., Biomimetic Anchor for Surface-Initiated Polymerization from Metal Substrates. *J. Am. Chem. Soc.* 2005, 127, 15843-15847.) More recently, a catechol-functionalized methacrylamide and a methacrylate ATRP inimer were copolymerized by free radical polymerization followed by deposition on Ti substrates for polymer brush growth. (See, Wang, X.; Ye, Q.; Gao, T.; Liu, J.; Zhou, F., Self-Assembly of Catecholic Macroinitiator on Various Substrates and Surface-Initiated Polymerization. *Langmuir* 2012, 28, 2574-2581.)

Polymer brushes patterned with nanoscale features have been generated by patterning a polymer brush growth-initiating substrate using various techniques, followed by polymer brush growth from the patterned substrate. For example, microcontact printing has been used to form a pattern in a substrate, followed by backfilling portions of the patterned substrate with a polymer brush growth-initiating material. Nanoimprint lithograph has also been used to form a pattern in a polymer-brush growth-initiating substrate. Alternatively, ultraviolet (UV) or electron beam lithography has been used to form a pattern in a polymer brush growth-initiating substrate.

SUMMARY

Block copolymer-based mask structures for the growth of patterned polymer brushes via surface-initiated atom transfer radical polymerization (SI-ATRP) are provided. Also provided are methods of making the mask structures and methods of using the mask structures to grow patterned polymer brushes.

One embodiment of a method of forming a lithographic mask from a self-assembled block copolymer film comprises: forming a neutral layer on a substrate surface, the neutral layer comprising a crosslinked copolymer film comprising crosslinked random copolymer chains having pendant alkyl halide functional groups that are capable of acting as ATRP initiators; depositing a block copolymer film over the neutral layer, and subjecting the block copolymer film to conditions that induce the block copolymer to self-assemble into patterned block copolymer domains; and selectively removing one or more of the block copolymer domains, such that regions of the neutral layer previously underlying said domains are exposed.

The resulting mask structure can be used in a method of making a polymer brush by forming the lithographic mask from the self-assembled block copolymer film and then exposing the exposed regions of the neutral layer to a solution comprising polymerizable monomers and a transition metal complex under reaction conditions in which the alkyl halide functional groups initiate the polymerization of the polymerizable monomers into a polymer brush via atom transfer radical polymerization.

Alternatively, the resulting mask structure can be used in a method of making a polymer brush by forming the lithographic mask from the self-assembled block copolymer film, depositing an ATRP-inert material over the exposed regions of the neutral layer; and subsequently removing one or more additional block copolymer domains, wherein additional regions of the neutral layer underlying said additional domains are exposed. Subsequently, the newly exposed regions of the neutral layer can be exposed to a solution comprising polymerizable monomers and a transition metal complex under reaction conditions in which the alkyl halide functional groups on the copolymer film initiate the polymerization of the polymerizable monomers into a polymer brush via atom transfer radical polymerization.

The random copolymers from which the crosslinked random copolymer films are formed are polymerized from a copolymer of a first monomer comprising an alkyl halide functional group that is capable of acting as an ATRP initiator (an inimer), a second monomer comprising a crosslinkable functional group, and a styrene monomer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Block copolymer-based mask structures for the growth of patterned polymer brushes via SI-ATRP are provided. Also provided are methods of making the mask structures and methods of using the mask structures to grow patterned polymer brushes.

The mask structures comprise a substrate having a surface, a neutral layer comprising a crosslinked random copolymer film disposed on the surface of the substrate and a domain-forming block copolymer film disposed on the crosslinked copolymer film. The block copolymer film may comprise block copolymer only or may comprise a blend of block copolymer and homopolymer.

The crosslinked copolymer film comprises crosslinked random copolymer chains having pendant alkyl halide functional groups that are capable of acting as ATRP initiating sites. The random copolymers from which the crosslinked copolymer film is formed are polymerized from one or more alkyl halide functional inimers, one or more monomers having a crosslinkable functionality, and styrene monomers. As such, the random copolymers are characterized by pendant ATRP initiating groups and pendant crosslinkable groups.

The relative amounts of inimer, crosslinkable monomer and styrene monomer in the random copolymers are selected to provide crosslinked copolymer films that serve dual functions. First, the films are able to initiate polymer brush growth via SI-ATRP and, second, they are able to provide a neutral layer for vertical domain formation in the overlying block copolymer film. As used herein, the term neutral layer refers to a layer that does not exhibit preferential wetting behavior—or that exhibits only a very weak preferential wetting behavior—toward a polymer block in the block copolymer, such that it provides for the induction of vertical domain formation in the block copolymer. The crosslinked random copolymer films are stable on a wide variety of substrate materials, even in the absence of covalent bonding to the substrate and in the presence of destabilizing organic solvents.

Figure 1:
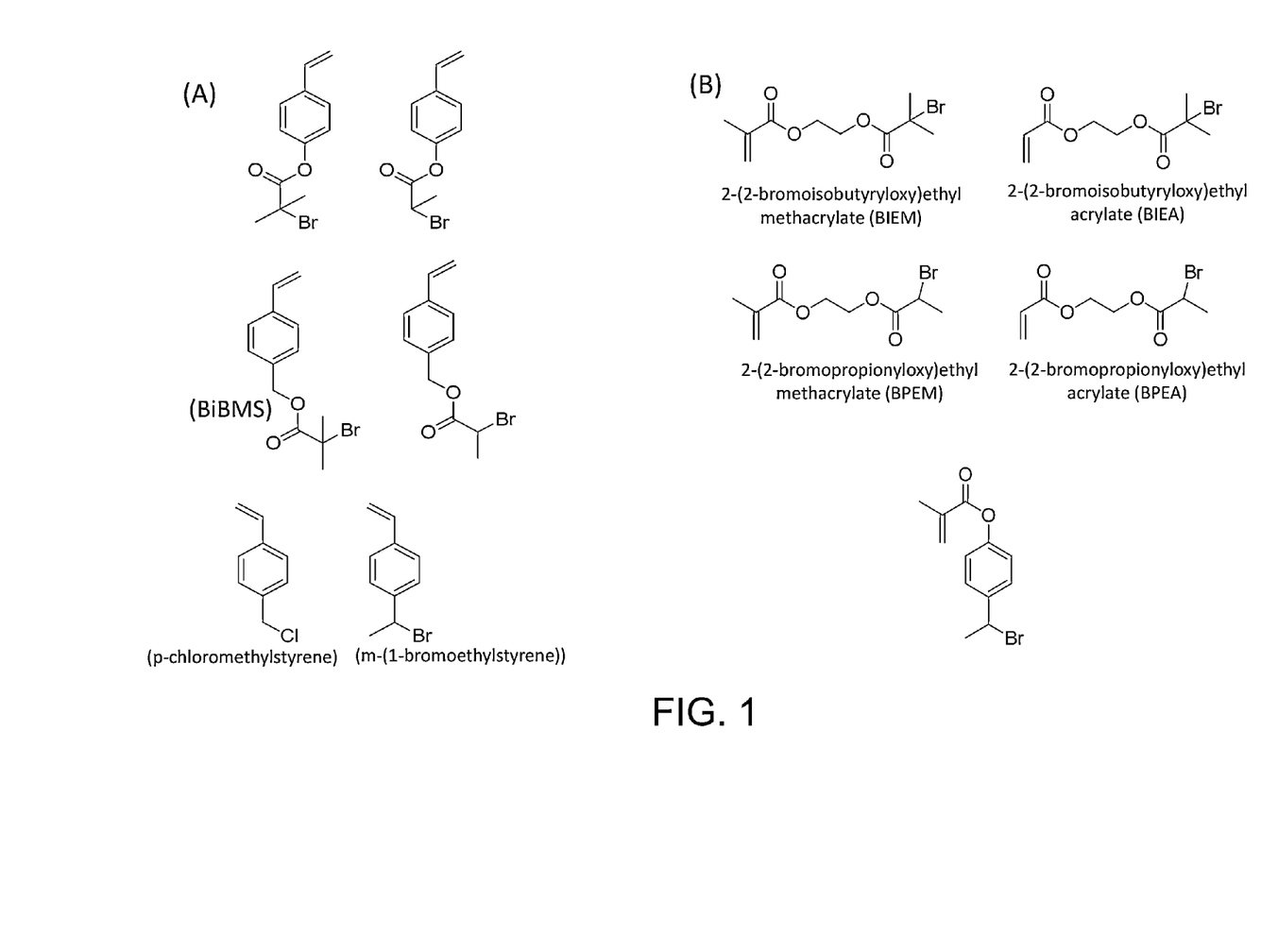
FIG. 1. (A) Structures of some styrene-based inimers; and (B) structures of some (meth)acrylate-based inimers.

The inimers used to synthesize the random copolymers comprise an ATRP initiating group and a monomer fragment. The ATRP initiating groups comprise alkyl halide groups, including secondary and tertiary alkyl halides. The monomer fragment is a portion of the inimer having a functional group that is polymerized into the copolymer backbone chain. Suitable monomer fragments include acrylates and methacrylates (collectively "(meth)acrylates") and styrenes. Thus, the inimers generally comprise alkyl halide group-containing ethylenically unsaturated monomers. 2-(2-bromoisobutyryloxy)ethyl methacrylate (BIEM) is one example of a suitable inimer. Other suitable inimers include 2-(2-bromoisobutyryloxy)ethyl acrylate (BIEA), 2-(2-bromopropionyloxy)ethyl acrylate (BPEA), 2-(2-bromopropionyloxy)ethyl methacrylate (BPEM), p-(2-bromoisobutyloylmethyl)styrene (BiBMS), p-chloromethylstyrene, and m-(1-bromoethyl)styrene. The structure of these and other suitable inimers are shown in FIGS. 1(A) and (B).

Figure 2:
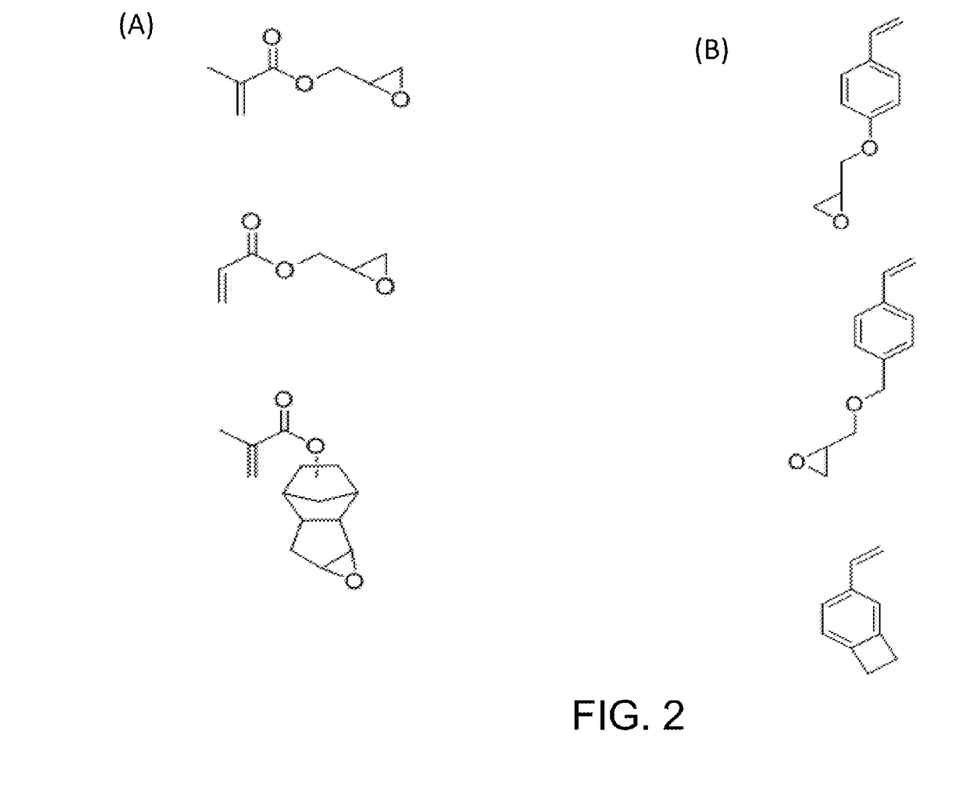
FIG. 2. (A) Structures of some (meth)acrylate-based crosslinkable monomers; and (B) structures of some styrene-based crosslinkable monomers.

The crosslinkable monomers employed as comonomers in the random copolymer synthesis comprise a crosslinkable functional group and a monomer fragment. The crosslinkable functional groups may be thermally crosslinkable groups (i.e., wherein crosslinking is induced by heating) or photo-crosslinkable groups (i.e., wherein crosslinking is induced by radiation), such as UV-crosslinkable groups. However, because radiation, such as UV radiation, can remove the halogen atoms from the initiating groups, thermally crosslinkable inimers may be preferred. Epoxy groups are an example of a suitable crosslinkable group. Like the monomer fragment of the inimer, the monomer fragment of the crosslinkable monomer may comprise a styrene group or a (meth)acrylate group. One example of a suitable self-crosslinkable monomer is glycidyl methacrylate (GMA). The structure of GMA, along with the structures of other suitable (meth)acrylate-based crosslinkable monomers, is shown in FIG. 2(A). The structures of some suitable styrene-based crosslinkable monomers—including a monomer comprising a cycloaliphatic unit based on styrene, are shown in FIG. 2(B). Other crosslinkable epoxy group-containing ethylenically unsaturated monomers can also be used as comonomers in the polymerization, including other aliphatic or bicyclic epoxides. Examples of such epoxy group-containing ethylenically unsaturated monomers can be found in U.S. Pat. No. 7,317,055.

Styrene monomers that may be employed as comonomers in the random copolymer synthesis include styrene, styrene derivatives, such as 4-tert-butylstyrene, and mixtures thereof.

The specific styrene monomers and the styrene monomer content in the random copolymer may be selected such that, in combination with the other monomers, they provide a neutral layer for a selected overlying block copolymer. Thus, the content of a particular styrene monomer, or combination of styrene monomers, will depend on the hydrophobicity of said monomer or monomers. For example, if 4-tert-butylstyrene is used instead of styrene, it can generally be used in a lower percentage than styrene as it is more hydrophobic.

In some embodiments, the random copolymers consist of or consist essentially of only styrene monomers, alkyl halide functional inimers, and monomers having a crosslinkable functionality. However, in some embodiments, one or more additional monomers are polymerized into the random copolymers. Such additional monomers can be selected such that, in combination with the other comonomers, they provide a neutral layer for a selected overlying block copolymer. Examples of such additional monomers include (meth)acrylate monomers, including derivatives of acrylate and methacrylate. Methods of copolymerizing styrenic monomers, (meth)acrylate monomers and monomers having crosslinkable epoxy groups or crosslinkable acryloyl groups are described in U.S. Pat. No. 8,362,179.

Figure 3:
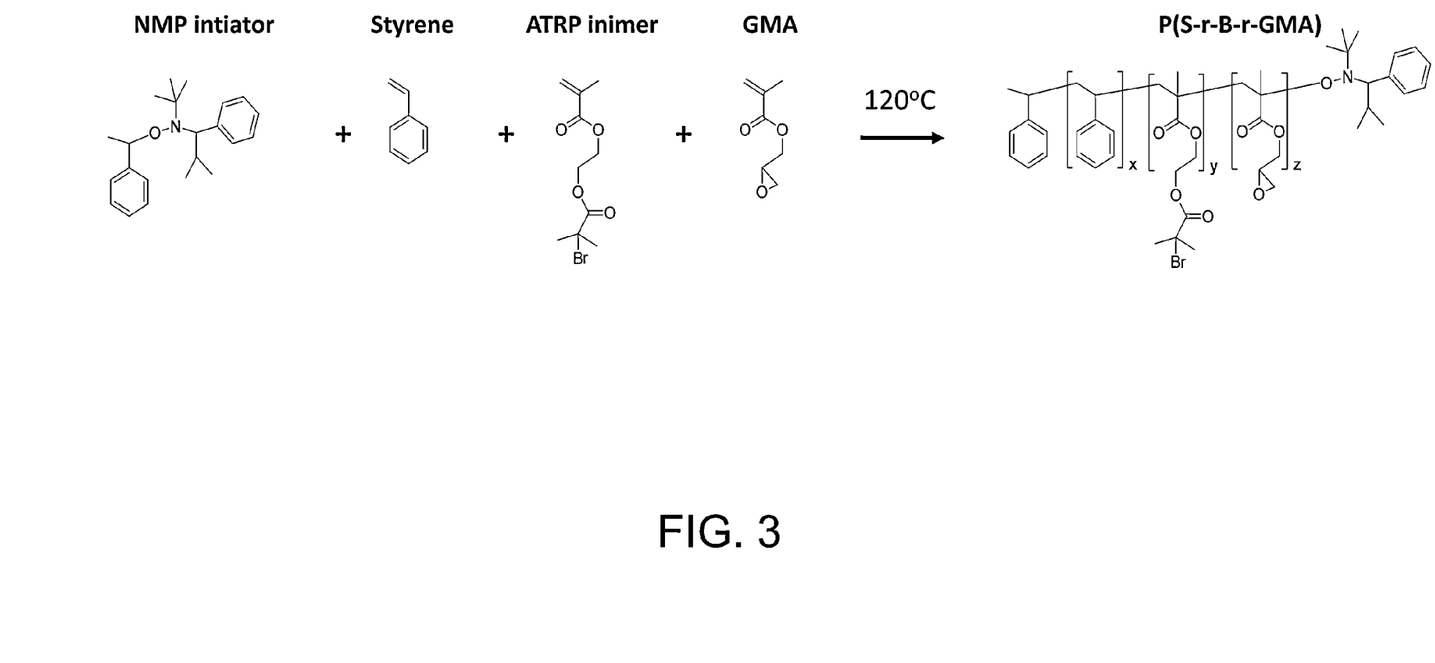
FIG. 3 shows the synthesis scheme and structure of a random copolymer polymerized from 2-(2-bromoisobutyryloxy)ethyl methacrylate inimers, glycidyl methacrylate (GMA) monomers and styrene monomers.

By way of illustration, a random copolymer may be copolymerized from BIEM as the inimer, GMA as the crosslinkable monomer, and styrene. The synthesis of such a copolymer is described in detail in the example below. The synthesis scheme and structure of the resulting copolymer chain is shown in FIG. 3.

The optimal monomer content of the random copolymers, which can be measured via $^1$H NMR spectroscopy, will depend on the monomer content of the overlying block copolymer and the desired domain morphology. However, the random copolymers desirably include enough of the crosslinkable monomer to provide a crosslinked thin film that is stable against delamination from the substrate. Typically, this can be accomplished with a low crosslinkable monomer content. For example, the crosslinkable monomer content can be less than about 10%. This includes embodiments of the random copolymers having a crosslinkable monomer content of no greater than about 5% (e.g., from about 1% to about 5%). In addition the ratios of styrene monomer, inimer, crosslinkable monomer and any additional monomers in the random copolymers should be balanced to provide a neutral layer for induction of vertical (also referred to as perpendicular) domain formation in the block copolymer. Notably, using the present random copolymers, a neutral layer having a sufficient crosslinking density can be provided even with random copolymers having a substantial inimer content (e.g., an inimer content of at least 20%, at least 30%, or at least 50%). For example, for a vertical cylinder-forming block copolymer comprising styrene and methylmethacrylate blocks, the random copolymer of the neutral layer may have a styrene monomer content in the range from about 60 to about 75% (e.g., from about 25% to about 30%) and an inimer content in the range from about 20 to about 35% (e.g., from about 25% to about 30%). Higher inimer contents can be used when a styrene derivative that is more hydrophobic than styrene is used as the styrene comonomer. For example, if 4-tert-butylstyrene is used as the styrene comonomer, the inimer content can be in the range from about 60 to about 80% of the random copolymer composition. (In the case where the inimers and/or the crosslinkable monomers are themselves styrene-based, the values for the styrene content provided above do not take those monomers into account. Instead, styrene-based inimers and crosslinkable monomers would be accounted for in the inimer content and crosslinkable monomer content of the random copolymer.)

The random copolymers can be synthesized using conventional polymerization techniques, including free-radical polymerization or reversible addition fragmentation chain-transfer (RAFT) polymerization techniques.

Once the random copolymers have been formed, they can be crosslinked into polymeric films bearing pendant ATRP initiating groups by the application of heat and/or light. By synthesizing the random copolymers before crosslinking them, problems related to blend immiscibility can be avoided, ensuring the fabrication of a highly homogeneous single-component polymer film.

The crosslinking can be carried out on a substrate surface by spreading the random copolymers on the surface using, for example, spin-coating techniques and then inducing the crosslinking reactions. For example, if the random copolymers comprise thermally crosslinkable pendant groups, crosslinking may be induced by subjecting the copolymers to a thermal anneal. Enough of the copolymer can be deposited onto the substrate surface to achieve a desired thickness for the crosslinked film. The crosslinked random copolymer film is desirably selected such that the chemical composition, rather than the film thickness, controls the orientation of the domains in the overlying block copolymer. For example, in some embodiments, the crosslinked random copolymer films have a thickness in the range from about 2 nm to about 20 nm. This includes embodiments of the films having a thickness in the range from about 2 nm to about 10 nm and further includes embodiments of the films having a thinkness in the range from about 2 nm to about 8 nm. However, thicknesses outside of these ranges may also be used. Generally, very thin films (e.g., those having a thickness of about 6 nm or less) will benefit from a higher crosslinking density in order to improve their stability against delamination from the surface of the underlying substrate.

The films can be crosslinked on a variety of substrates and do not need to form covalent bonds with the substrates to achieve stability against delamination. Thus, although covalent bonds may be formed between the random copolymers and the underlying substrate in some instances (as in the case where the substrate comprises an oxide), in some embodiments there is no covalent bonding between the crosslinked films and the underlying substrate. Examples of substrate materials on which the crosslinked films may be formed include silicon, silicon dioxide, metals (e.g., noble metals, such as gold and platinum), glass, indium-tin-oxide (ITO) coated glass and magnesium oxide. The substrate surfaces upon which the films are formed may be planar or non-planar surfaces.

Once the crosslinked random copolymer films have been formed, a layer of vertical domain-forming block copolymer can be deposited over the film using a coating technique such as spin-coating. The block copolymer can then be subjected to conditions that induce the formation of a pattern of vertical domains in the block copolymer film. The morphology of the vertical domains can vary. In some embodiments, the domains comprise cylinders. In other embodiments, the domains comprise lamellae. By "vertical" or "perpendicular" it is meant that the molecular structures within the domains form an approximate, but not necessarily exact, right angle with the surface of the substrate.

The step of subjecting the block copolymer to conditions that induce it to undergo domain formation include subjecting the block copolymer to a thermal anneal for a time sufficient to allow the block copolymer to self-assemble into domains or subjecting the block copolymer to a solvent anneal. During a solvent anneal, the block copolymer film undergoes swelling as it is exposed to a saturated solvent vapor atmosphere, typically at room temperature (23° C.), for a time sufficient to allow the block copolymer to self-assemble into domains.

Suitable vertical domain-forming block copolymers include block copolymers of vinyl monomers and acrylate monomers, including block copolymers of styrene and methylmethacrylate, P(S-b-MMA). For example, a block copolymer of styrene and methylmethacrylate can be used to form vertically oriented, hexagonally-packed cylindrical domains. The molecular weight of the components that make up the block copolymer can vary, depending on the desired domain morphology. By way of illustration only, in some embodiments, the number average molecular weight of the polystyrene in a P(S-b-MMA) pattern-forming layer ranges from about 20,000 to 50,000, while the number average molecular weight of the polymethyl methacrylate ranges from about 8,000 to 25,000. In some embodiments, the block copolymer film comprises a block copolymer blended with a homopolymer into order to provide a desired domain morphology. For example a P(S-b-MMA) block copolymer can be blended with a PMMA homopolymer to provide an array of vertical cylinders in a hexagonal packing arrangement. Other vertical domain-forming block copolymers for which the random copolymers can provide neutral layers in BCP lithography applications include, but are not limited to, polystyrene-block-2 vinyl pyridine (P(S-b-2VP)) and polystyrene-block-lactic acid (P(S-b-lactic acid)).

Figure 4:
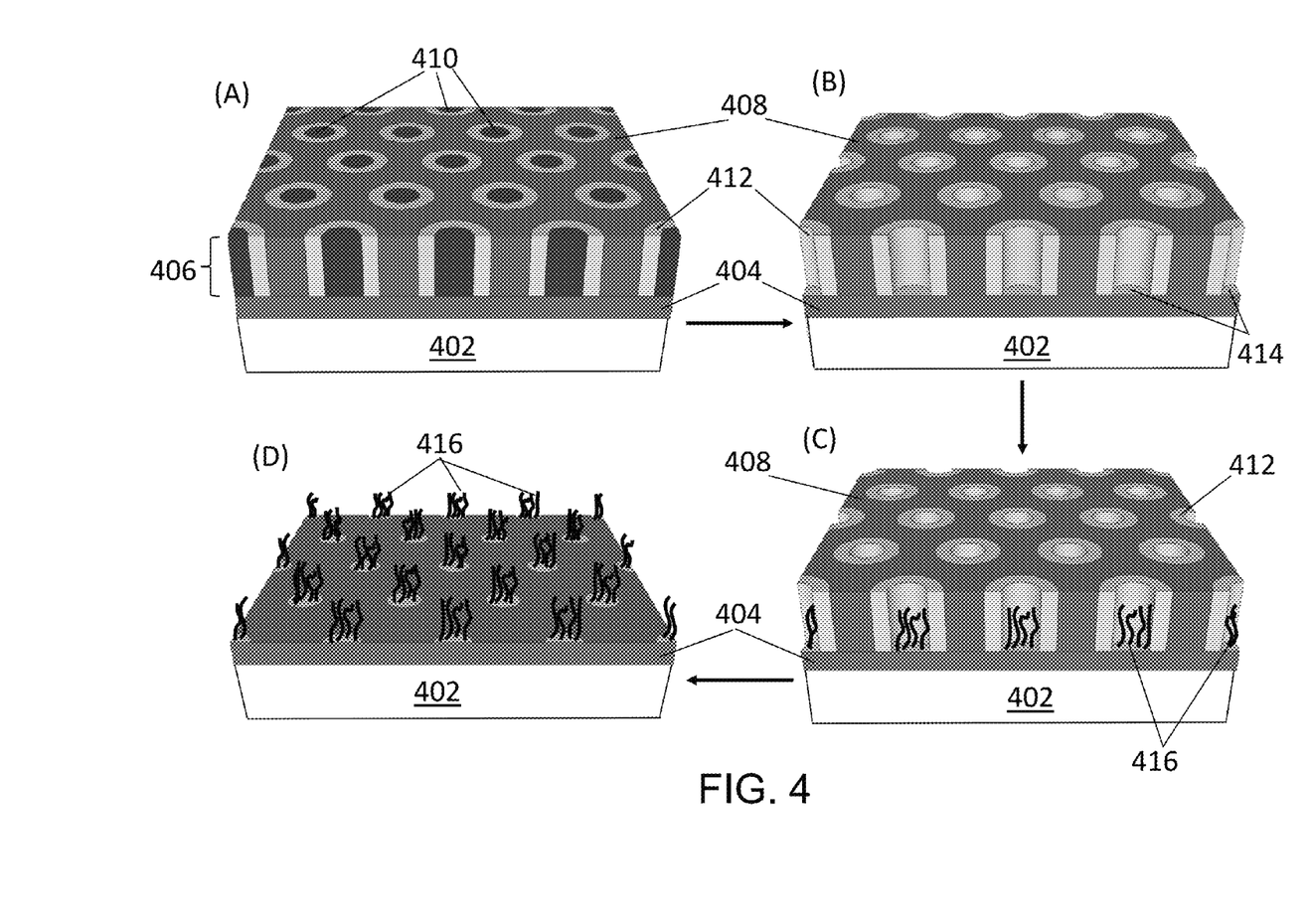
FIG. 4 is a schematic illustration of the process of forming a block copolymer-based mask structure and subsequently growing a patterned polymer brush using the mask structure.

FIG. 4 is a schematic diagram illustrating the fabrication and use of the present block copolymer-based mask structures. Panel (A) of FIG. 4 shows an initial structure comprising a substrate 402, a crosslinked random copolymer film 404 disposed on the surface of substrate 402 and a block copolymer film 406 comprising a plurality of vertical cylindrical domains in a hexagonal packing arrangement and a matrix domain 408 disposed around the cylindrical domains. In this embodiment, the cylindrical domains each comprise an inner cylindrical domain 410 surrounded coaxially with an outer cylindrical domain 412. This domain morphology can be achieved using a block copolymer film comprising block copolymer/homopolymer blend, as described in the example below.

As shown in panel (B) of FIG. 4, in order to provide a mask over crosslinked random copolymer film 404, one or more sets of the domains in the self-assembled block copolymer film (here, inner cylindrical domains 410) are selectively removed to expose regions 414 of crosslinked random copolymer film 404. For example, selective removal can be carried out using a selective wet chemical or dry etch.

In some embodiments, the ATRP initiating alkyl halide groups on exposed regions 414 are then used to grow a patterned polymer brush 416 via SI-ATRP as shown in panel (C) of FIG. 4. The remainder of the block copolymer film can then be removed from the structure (panel (D)), leaving the patterned polymer brush. The pattern defined by the patterned polymer brush will correlate with the pattern defined by the overlying block copolymer film. Thus, in this embodiment, the patterned polymer brush may comprise a plurality of polymer brush islands disposed in a hexagonal packing arrangement.

In an alternative embodiment, exposed regions 414 are coated with an ATRP-inert material (that is, a material that does not act as an initiator for SI-ATRP). One or more of the remaining block copolymer domains can then be selectively removed such that other regions of the crosslinked random copolymer film are now exposed. A patterned polymer brush can then be grown selectively from the newly-exposed regions. The patterned defined by the polymer brush in this embodiment will correspond to the pattern of matrix domain 408 and will include a plurality of regions (islands) comprising the ATRP-inert material that are free of the polymer brush.

Although the patterned polymer brush is illustrated using cylindrical block copolymer domains to form a polymer brush grafted in an island pattern. Other patterns are possible. For example, lamellar block copolymer domains can be used to graft a patterned polymer brush that defines a striped pattern. The stripes in said pattern may substantially linear or may form a fingerprint pattern, depending on the morphology of the block copolymer domains. Because the domains in the block copolymer can be formed with nanoscale dimensions (e.g., with dimensions, such as cylinder diameters or lamellae thicknesses, of ≤1000 nm, ≤100 nm or ≤10 nm) the features in the patterned polymer brush layer can have correspondingly small dimensions (e.g., island diameters or stripe widths).

During SI-ATRP, exposed regions of the crosslinked copolymer film are exposed to a solution comprising polymerizable monomers and a transition metal complex catalyst under reaction conditions in which the halides of the copolymer film initiate the polymerization of the polymerizable monomers via ATRP. In the initiation step of the ATRP process, the transition metal catalyst abstracts a halogen atom from an alkyl halide functional group on the crosslinked film, creating a radical that is able to add to a polymerizable monomer from the solution. This creates another radical species that is able to propagate the radical polymerization process. The result is a polymer brush comprising an assembly of a polymer chains, each of which is attached at one end to the crosslinked random copolymer film. The polymer chains of the polymer brush are typically characterized by well-defined molecular weights and low polydispersity indices (e.g., $M_w/M_n \leq 1.5$). The polymer chains of the brush may be linear, branched or hyperbranched.

Monomers that can be polymerized or copolymerized into polymer brushes via SI-ATRP include, vinyl monomer, such as styrenes, acrylates and methacrylates, and combinations thereof. The monomers can be functionalized or unfunctionalized. A description of various monomers that can be polymerized via SI-ATRP can be found in Coessens et al., Functional Polymers by Atom Transfer Radical Polymerization, *Prog. Polym. Sci.* 26 (2001) 337-377. The example below demonstrates SI-ATRP growth of a 2-hydroxyethyl methacrylate (HEMA) polymer brush using a block-copolymer based growth mask.

Although some of the ATRP initiating halogen atoms may be lost during the crosslinking process, the crosslinked films made from random copolymers having a high ATRP initiator content will themselves have a high ATRP initiator content and, therefore, provide a high grafting density for the growth of polymer brushes. For example, some embodiments of polymer brushes grafted from the crosslinked films have a grafting density of at least 0.5 chains/nm$^2$. This includes polymer brushes grafted with a grafting density of at least 0.7 chains/nm$^2$ and further includes polymer brushes grafted with a grafting density of at least 0.9 chains/nm$^2$. These grafting density values refer to values measured according the methods described in the example below.

EXAMPLE

Experimental Section

Materials.

All chemicals were purchased from Sigma-Aldrich and used without further purification unless otherwise noted.

4-vinylbenzyl alcohol was synthesized according to a literature procedure. (Zhao, L. J.; Kwong, C. K. W.; Shi, M.; Toy, P. H. *Tetrahedron* 2005, 61, 12026-12032.) Copper(I) chloride (99.999%) was stirred in acetic acid overnight, suction-filtered, washed with ethanol and then dried under vacuum. 2-(2-bromoisobutyryloxy)ethyl methacrylate (BIEM), styrene, glycidyl methacrylate and 2-hydroxyethyl methacrylate (HEMA) were stirred over calcium hydride and then distilled under vacuum. 2,2'-azobis(2-methylpropionitrile) (AIBN) was recrystallized from acetone and dried under vacuum. 2,2,5,5-Tetramethyl-3-(1-phenylethoxy)-4-phenyl-3-azahexane (NMP initiator) and p-(2-bromoisobutyloylmethyl)styrene (BiBMS) were synthesized following the literature. (Benoit, D.; Chaplinski, V.; Braslau, R.; Hawker, C. J. *J. Am. Chem. Soc.* 1999, 121, 3904-3920. and Sweat, D. P.; Kim, M.; Yu, X.; Gopalan, P. *Langmuir*, 2013, ASAP, dx.doi.org/10.1021/la305060z).

Synthesis of P(S-r-BIEM-r-GMA).

A series of P(S-r-BIEM-r-GMA) was synthesized via nitroxide mediated polymerization with varied feed ratio of styrene (0.80~0.55) and BIEM (0.16~0.41), and fixed feed ratio (0.04) of GMA, following a procedure reported earlier. (Han, E.; Gopalan, P. *Langmuir* 2010, 26, 1311-1315.) For typical example, the mixture of BIEM (2.67 g, 11.43 mmol), GMA (0.21 g, 1.48 mmol), styrene (2.50 g, 23.96 mmol), and NMP initiator (20 mg, 0.061 mmol) was degassed via three freeze-pump-thaw cycles and placed in an oil bath at 120° C. for 36 hours. The resultant oil was then diluted with THF and precipitated into hexane. The polymer was collected as a white powder and dried under vacuum.

Synthesis of P(S-r-BiBMS-r-GMA).

A series of P(S-r-BiBMS-r-GMA) was synthesized via free radical polymerization with varied feed ratio of styrene (0.79~0.55), BiBMS (0.20~0.30) and GMA (0.01~0.15). As a typical example, BiBMS (0.849 g, 3 mmol), GMA (0.071 g, 0.5 mmol), styrene (0.68 g, 6.5 mmol), and AIBN (4.1 mg, 0.025 mmol) were added to 3 grams anisole in a 10 mL Schlenk flask equipped with a magnetic stir bar. The mixture was degassed via three freeze-pump-thaw cycles and placed in an oil bath at 60° C. for 16 hours. The polymerization was quenched by cooling the flask with cold water and exposure to air. The resulting viscous oil was then diluted with THF and precipitated into hexane. The polymer was collected as a white powder and dried under vacuum.

Substrate Preparation and Thin Film Formation.

Figure 5:
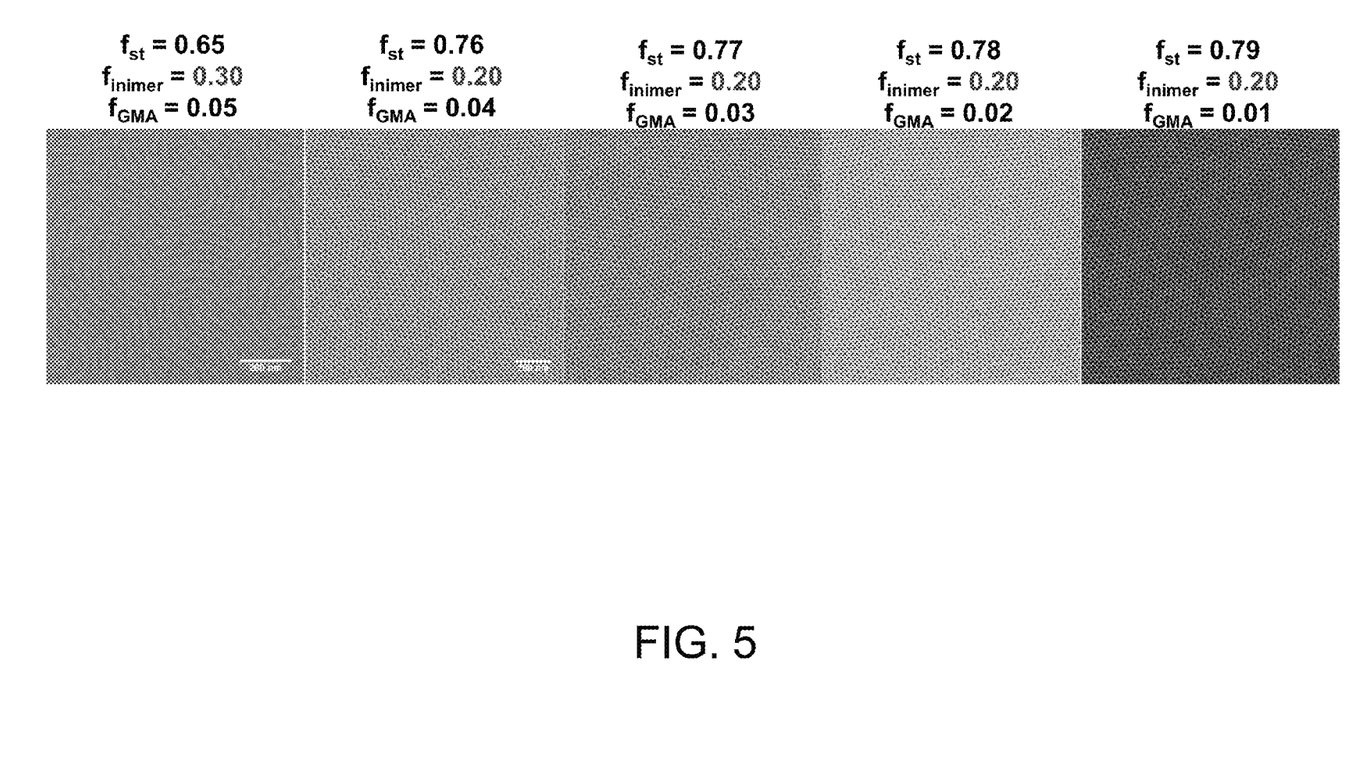
FIG. 5 shows top down SEM images of self-assembled P(S-b-MMA) block copolymers having different styrene monomer contents on a P(S-r-BiBMS-r-GMA) neutral layer, as described in the Example.
Figure 6:
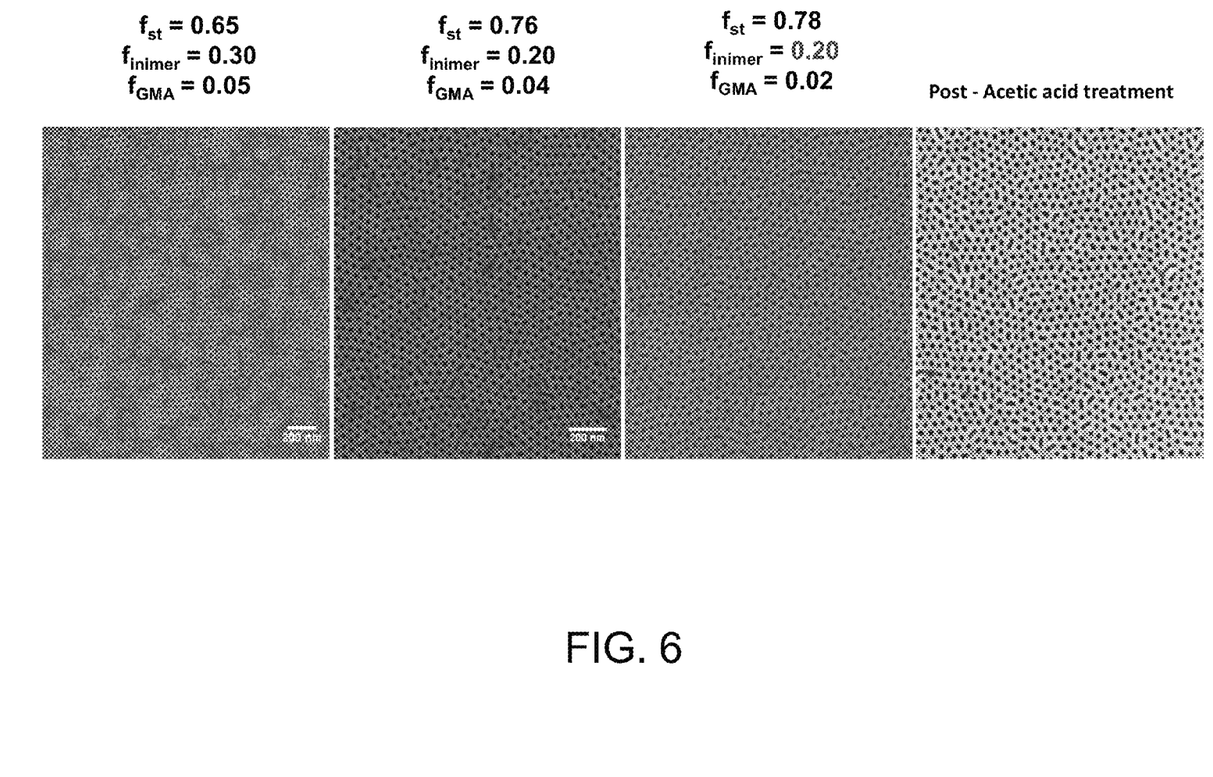
FIG. 6 shows top down SEM images of self-assembled P(S-b-MMA) (PMMA) blending polymers having different styrene monomer contents on the P(S-r-BiBMS-r-GMA) neutral layer, as described in the Example. The final panel in FIG. 6 shows the mask structure after the selective removal of the cylindrical PMMA domains.

A solution of P(S-r-BIEM-r-GMA) or P(S-r-BiBMS-r-GMA) (0.3% w/w) in toluene was spin-coated onto silicon wafers that had been cleaned using piranha acid (7:3 $H_2SO_4$: $H_2O_2$, caution: reacts violently with organic compounds). The substrate was then annealed under vacuum at 220° C. for 5 min. After annealing, the substrate was soaked in toluene and rinsed copiously with fresh toluene to remove uncross-linked polymer, resulting in 5~11 nm thick cross-linked thin film. On these cross-linked mats, a solution of cylinder forming P(S-b-MMA) ($M_n$(PS)~46 k, $M_n$(PMMA)~21 k) in toluene (1.0 wt %) or a blending solution of cylinder forming P(S-b-MMA) (MMA)($M_n$(PS)~50 k, $M_n$(PMMA)~20 k) and PMMA ($M_n$~20 k) in toluene (1.0 wt % or 1.5 wt %, weight ratio of PMMA to P(S-b-MMA)=0.114) was spin-coated at 4000 rpm to produce films with BCP thicknesses of 25 nm or 37 nm. All BCP films were annealed at 220° C. for 10 min under vacuum to drive self-assembly of block copolymer domains. Annealed blending thin film samples were further treated with acetic acid for 20 min, followed by DI water rinsing, to create porous structure by extracting PMMA homopolymer. FIG. 5 shows top down SEM images of self-assembled P(S-b-MMA) block copolymers having different styrene monomer contents on a P(S-r-BiBMS-r-GMA) neutral layer. FIG. 6 shows top down SEM images of self-assembled P(S-b-MMA) (PMMA) blending polymers having different styrene monomer contents on the P(S-r-BiBMS-r-GMA) neutral layer. The final panel in FIG. 6 shows the mask structure after the selective removal of the cylindrical PMMA domains.

Surface-Initiated Atom Transfer Radical Polymerization (SI-ATRP).

HEMA (2.5 grams, 19.21 mmol), tris-(2-pyridylmethyl)amine (100 mg, 0.34 mmol), CuCl (35 mg, 0.35 mmol), $CuCl_2$ (6 mg, 0.45 mmol), and methyl alcohol (100 ml) were mixed and sonicated until the copper completely dissolved into the yellow-green solution. The mixture was then added to the flask containing substrates covered with porous BCP template and magnetic stir bars. The flasks were then degassed via three freeze-pump-thaw cycles. After warming to room temperature using a water bath, the flasks were immersed in a 35° C. oil bath for various amounts of time. After the requisite amount of time elapsed, the flasks were cooled to room temperature using running water and the flask opened to atmosphere. The substrate was then removed from the flask and washed copiously with water. After washing, the substrate was further soaked in THF for 2 hours, then sonicated in THF for 10 minutes, followed by rinsing with THF to remove porous BCP template and ungrafted polymer chains and dried using a stream of nitrogen.

Characterization.

$^1$H NMR and $^{13}$C NMR spectrums were recorded in $CDCl_3$ using a Bruker Avance-400 spectrometer with TMS as internal standard. Gel-permeation chromatography (GPC) was performed using a Viscotek 2210 system equipped with three Waters columns (HR 4, HR 4E, HR 3) and a 1 mL/min flow rate of THF as eluent at 30° C. Monodisperse PS standards were used for calibration. The film thickness of the samples was measured by ellipsometry (Rudolph Research Auto EL). The surface topography of the cross-linked mat and brush layer was examined using a Nanoscope III Multimode atomic force microscope (Digital Instruments) in tapping mode. Top-down scanning electron microscope (SEM) images of the BCP microdomains were acquired using a LEO-1530 field-emission instrument using an accelerating voltage of 1 kV. X-ray photoelectron spectroscopy (XPS) was done on a PerkinElmer 5400 ESCA spectrometer Phi model using a Mg X-ray source (300 W, 15 kV) at a takeoff angle of 45° from the substrate normal. The hemispherical energy analyzer was used in hybrid mode with a 1 mm×3.5 mm area aperture. Survey spectra were collected at pass energy of 89.45 eV with a scan step size of 1.0 eV. High-resolution multiplex spectra were collected with pass energy of 35.75 eV and a step size of 0.05 eV.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a lithographic mask from a self-assembled block copolymer film, the method comprising:
    forming a neutral layer on a substrate surface, the neutral layer comprising a crosslinked copolymer film comprising crosslinked random copolymer chains having pendant alkyl halide functional groups that are capable of acting as ATRP initiators;
    depositing a block copolymer film over the neutral layer, and subjecting the block copolymer film to conditions that induce the block copolymer to self-assemble into patterned block copolymer domains; and
    selectively removing one or more of the block copolymer domains, such that regions of the neutral layer previously underlying said domains are exposed.

2. The method of claim 1, further comprising:
    depositing an ATRP-inert material over the exposed regions of the neutral layer; and
    subsequently removing one or more additional block copolymer domains, wherein additional regions of the neutral layer underlying said additional domains are exposed.

3. The method of claim 2, wherein the ATRP-inert material is a noble metal.

4. The method of claim 1, wherein the random copolymer is a copolymer of a first monomer comprising an alkyl halide functional group that is capable of acting as an ATRP initiator, a second monomer comprising a crosslinkable functional group, and a styrene monomer.

5. The method of claim 4, wherein the first monomer is selected from acrylate monomers having an alkyl halide functional group, methacrylate monomers having an alkyl halide functional group, styrene monomers having an alkyl halide functional group, or combinations thereof.

6. The method of claim 4, wherein the crosslinkable functional groups comprise thermally self-crosslinking functional groups.

7. The method of claim 6, wherein the crosslinkable functional groups comprise thermally crosslinkable epoxy groups.

8. The method of claim 7, wherein the random copolymer comprises from about 15 to 35% of polymerized first monomers, from about 1 to about 4% of glycidyl methacrylate, and from about 60 to about 80% of polymerized styrene.

9. The method of claim 1, wherein the block copolymer is a diblock copolymer of styrene and methylmethacrylate.

10. The method of claim 7, wherein the block copolymer is a diblock copolymer of styrene and methyl methacrylate.

11. The method of claim 1, wherein the block copolymer domains comprise vertically oriented cylindrical domains.

12. The method of claim 1, wherein the block copolymer domains comprise vertically oriented lamellar domains.

13. The method of claim 1, wherein the random copolymer is polymerized from (meth)acrylate monomers having an alkyl halide functional group, glycidyl methacrylate monomers and styrene monomers and the block copolymer is a cylinder-forming block copolymer of styrene and methylmethacrylate.

14. A method of making a polymer brush, the method comprising:
    forming a lithographic mask from a self-assembled block copolymer film, according to the method of claim 1; and
    exposing the exposed regions of the neutral layer to a solution comprising polymerizable monomers and a transition metal complex under reaction conditions in which the alkyl halide functional groups initiate the polymerization of the polymerizable monomers into a polymer brush via atom transfer radical polymerization.

15. The method of claim 14, further comprising removing the remainder of the block copolymer film.

16. A method of making a polymer brush, the method comprising:
    forming a lithographic mask from a self-assembled block copolymer film, according to the method of claim 2;
    exposing the exposed regions of the neutral layer to a solution comprising polymerizable monomers and a transition metal complex under reaction conditions in which the alkyl halide functional groups on the copolymer film initiate the polymerization of the polymerizable monomers into a polymer brush via atom transfer radical polymerization.

* * * * *